United States Patent
Lee

(10) Patent No.: US 8,569,832 B2
(45) Date of Patent: Oct. 29, 2013

(54) VERTICAL TRANSISTOR HAVING FIRST AND SECOND TENSILE LAYERS

(75) Inventor: Eun Sung Lee, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 74 days.

(21) Appl. No.: 13/314,532

(22) Filed: Dec. 8, 2011

(65) Prior Publication Data

US 2012/0080745 A1    Apr. 5, 2012

Related U.S. Application Data

(62) Division of application No. 12/329,190, filed on Dec. 5, 2008, now Pat. No. 8,093,127.

(30) Foreign Application Priority Data

Jan. 2, 2008    (KR) .................. 10-2008-0000313

(51) Int. Cl.
| | |
|---|---|
| H01L 29/76 | (2006.01) |
| H01L 29/94 | (2006.01) |
| H01L 31/062 | (2012.01) |
| H01L 31/113 | (2006.01) |
| H01L 31/119 | (2006.01) |

(52) U.S. Cl.
USPC .................................. 257/329; 257/E29.262

(58) Field of Classification Search
USPC ........................................ 257/329, E29.262
See application file for complete search history.

(56) References Cited

U.S. PATENT DOCUMENTS

| | | |
|---|---|---|
| 5,578,850 A | 11/1996 | Fitch et al. |
| 6,936,869 B2 | 8/2005 | Webb et al. |
| 7,205,604 B2 | 4/2007 | Ouyang et al. |
| 7,217,974 B2 | 5/2007 | Forbes et al. |
| 7,514,324 B2 | 4/2009 | Leslie |
| 7,759,191 B2 | 7/2010 | Cheng et al. |
| 2007/0122953 A1 | 5/2007 | Liu et al. |

FOREIGN PATENT DOCUMENTS

| | | |
|---|---|---|
| JP | 2002-057329 A | 2/2002 |
| KR | 1020070002739 A | 1/2007 |

OTHER PUBLICATIONS

USPTO RR mailed Jun. 2, 2010 in connection with U.S. Appl. No. 12/329,190.
USPTO NFOA mailed Aug. 20, 2010 in connection with U.S. Appl. No. 12/329,190.
USPTO FOA mailed Jan. 12, 2011 in connection with U.S. Appl. No. 12/329,190.
USPTO NOA mailed Sep. 8, 2011 in connection with U.S. Appl. No. 12/329,190.

*Primary Examiner* — Howard Weiss
(74) *Attorney, Agent, or Firm* — Ladas & Parry LLP

(57) ABSTRACT

A vertical transistor includes a semiconductor substrate provided with a pillar type active pattern over the surface thereof. A first tensile layer is formed over the semiconductor substrate and around the lower end portion of the pillar type active pattern, and a second tensile layer is formed over the upper end portion of the pillar type active pattern so that a tensile stress is applied in a vertical direction to the pillar type active pattern. A first junction region is formed within the surface of the semiconductor substrate below the first tensile layer and the pillar type active pattern. A gate is formed so as to surround at least a portion of the pillar type active pattern. A second junction region is formed within the upper end portion of the pillar type active pattern.

13 Claims, 7 Drawing Sheets

VERTICAL TRANSISTOR HAVING FIRST AND SECOND TENSILE LAYERS

CROSS-REFERENCE TO RELATED APPLICATIONS

The present application claims priority to Korean patent application number 10-2008-0000313 filed on Jan. 2, 2008, which is incorporated herein by reference in its entirety. The present application is a division of application Ser. No. 12/329,190, now U.S. Pat. No. 8,093,127.

BACKGROUND OF THE INVENTION

The present invention relates generally to a vertical transistor and a method for forming the same, and more particularly, to a vertical transistor with improved operation speed and a method for forming the same.

Various technologies are used to form a transistor in a semiconductor device. One such technology that currently has wide use is a Metal Oxide Semiconductor Field Effect Transistor (MOSFET). Typically, a semiconductor substrate will be divided into a peripheral region and a cell region, and MOSFETs are formed on the respective regions of a semiconductor substrate. A typical MOSFET includes a stacked structure of a gate insulation layer and a gate conductive layer. The gate conductive layer is generally formed of a polysilicon layer or a stacked layer including a polysilicon layer and a metal layer.

Trends in the semiconductor industry have lead to a reduced design rule, and the semiconductor industry is constantly pursuing an enhanced degree of integration of semiconductor devices while increasing the operation speed and the yield of the semiconductor devices.

Vertical transistors are often suggested as a device capable of overcoming the current limitations (such as the capability of a high level of integration and limitations in current characteristics) of existing transistors.

Unlike the existing transistor, which includes a gate and source/drain regions formed in a substrate at respective sides of the gate thereby having a horizontal channel, the vertical transistor includes a gate and source/drain regions formed above and below the gate respectively, and thereby, the vertical transistor is formed with a vertical channel.

A typical vertical transistor having a vertical channel is formed in a manner such that a pillar type active pattern extends vertically to a main surface of the semiconductor substrate, an annular gate is formed so that the annular gate surrounds a lower end portion of the pillar type active pattern, and the source region and the drain region are respectively formed above and below a channel unit of the pillar type active pattern surrounded by the annular gate.

This vertical transistor can be advantageously employed in highly integrated devices, since the vertical transistor has an increased current and a decreased size.

However, the conventional vertical transistor described above has the inevitable problem of increased parasitic capacitance since the gate structurally surrounds the pillar type active pattern. One particular disadvantage is the deterioration of current properties caused by the increase in the parasitic capacitance, which in turn causes a problem of RC delay. Also, an additional complication exists in that the operation speed is lowered by the parasitic capacitance when the vertical transistor is employed in an NMOS having a relatively large depletion ratio of a polysilicon layer.

SUMMARY OF THE INVENTION

Embodiments of the present invention include a vertical transistor that is able to enhance the current properties of the devise despite an increase in parasitic capacitance and a method for forming the same.

Also, embodiments of the present invention are directed to a vertical transistor that is able to improve the mobility of an NMOS and a method for forming the same.

In addition, embodiments of the present invention are directed to a vertical transistor that is able to enhance operation speed through the improvement of the mobility of an NMOS and a method for forming the same.

In one embodiment, a vertical transistor includes a semiconductor substrate provided with a pillar type active pattern over the surface thereof; a first tensile layer formed over the semiconductor substrate and around the lower end portion of the pillar type active pattern and a second tensile layer formed over the upper end portion of the pillar type active pattern so that a tensile stress is applied in a vertical direction to the pillar type active pattern; a first junction region formed within the surface of the semiconductor substrate below the first tensile layer and the pillar type active pattern; a gate formed so as to surround at least a portion of the pillar type active pattern; and a second junction region formed within the upper end portion of the pillar type active pattern.

The pillar type active pattern can be formed as an epitaxial Si layer.

The first and second tensile layers may include an $Si_{1-x}C_x$ layer, and x is in a range of $0.01 \leq x \leq 0.05$.

The second tensile layer may be formed so as to cover the side and upper surface of the upper end portion of the pillar type active pattern.

In another embodiment, a method for forming a vertical transistor includes the steps of forming a first junction region within a surface of the semiconductor substrate; forming a first tensile layer over the first junction region; forming a conductive layer over the first tensile layer; forming a hole exposing the first junction region by etching the conductive layer and the first tensile layer; forming a pillar type active pattern over the hole so that the pillar type active pattern protrudes from the conductive layer; forming a second tensile layer over the protruded upper portion of the pillar type active pattern; forming a gate surrounding the pillar type active pattern by etching the conductive layer; and forming a second junction region over the protruded upper portion of the pillar type active pattern.

The pillar type active pattern may be formed as an to epitaxial Si layer.

The step of forming the pillar type active pattern includes the steps of forming a Si layer over the conductive layer including a surface of the hole; removing portions of the Si layer formed at the bottom of the hole and the upper portion of the conductive layer; and growing an epitaxial Si layer from the bottom of the hole so that the epitaxial Si layer protrudes above the conductive layer.

The step of growing the epitaxial Si layer may be carried out by a Selective Epitaxial Growth (SEG) process.

The first and second tensile layers may include an $Si_{1-x}C_x$ layer, and x is in a range of $0.01 \leq x \leq 0.05$.

The $Si_{1-x}C_x$ layer may formed using Molecular Beam Epitaxy (MBE) process or cluster ion implantation process.

The MBE process is carried out using $Hi_2H_6$ gas and $C_2H_2$ gas.

The MBE process is carried out at a temperature in the range of 200 to 1000° C.

The second tensile layer is formed so as to cover the side and upper surface of the upper end portion of the pillar type active pattern.

The step of forming the second junction region includes the steps of forming an insulation layer over the semiconductor substrate formed with the gate so that the insulation layer covers the second tensile layer; exposing the portion of the second tensile layer formed at the upper surface of the pillar type active pattern by etching the insulation layer; and ion implanting N-type impurities into the exposed portion of the second tensile layer and the upper end portion of the pillar type active pattern below the second tensile layer.

The first junction region may be formed as an N-type ion implantation layer.

DESCRIPTION OF SPECIFIC EMBODIMENTS

Hereinafter, preferred embodiments of the present invention will be described in detail with reference to accompanying drawings.

Figure 1:
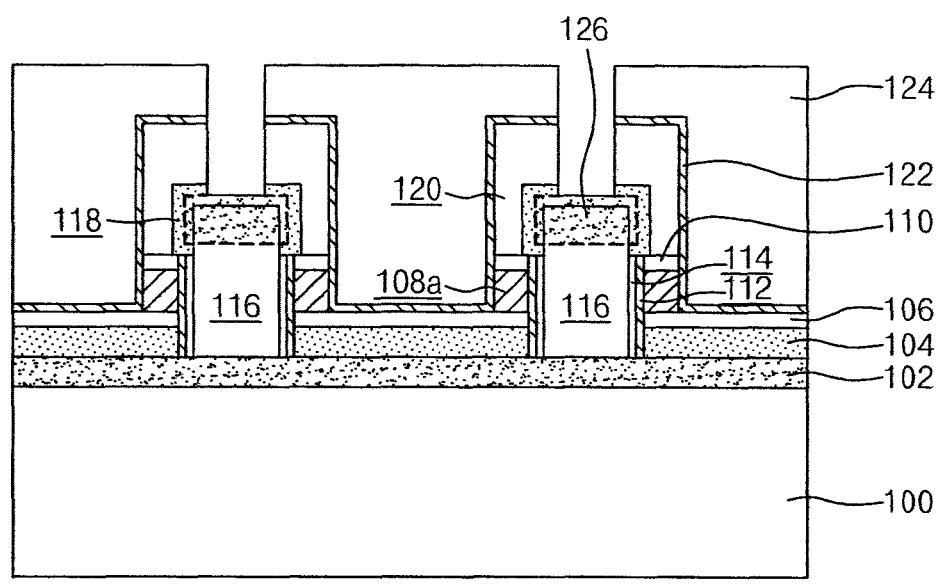
FIG. 1 is a cross-sectional view showing a vertical transistor in accordance with an embodiment of the present invention.

FIG. 1 is a cross-sectional view showing a vertical transistor in accordance with an embodiment of the present invention.

As shown, a pillar type active pattern 116 is provided over a surface of a semiconductor substrate 100. In an embodiment of the present invention, the pillar type active pattern 106 is formed as an epitaxial Si layer. A first tensile layer 104 is formed over a portion of the semiconductor substrate 100 around the lower end portion of the active pattern 116, and a second tensile layer 118 is formed around the upper end portion of the active pattern 116. Preferably, the first tensile layer 104 is formed so as to surround the lower end portion of the active pattern 116, and the second tensile layer 118 is formed so as to surround the upper and side surfaces of the upper end portion of the active pattern 116. The first and second tensile layers 104, 118 act to apply a tensile stress to the lower and upper end portions of the pillar type active pattern 116, respectively. In an embodiment of the present invention, the first and second tensile layers 104, 118 are each made of an $Si_{1-x}C_x$ layer ($0.01 \leq x \leq 0.05$), and preferably a $Si_{0.99}C_{0.01}$ layer.

A first junction region 102 is formed within the surface of the semiconductor substrate 100 below the first tensile layer 104 and the pillar type active pattern 116, and a second junction region 126 is formed in the upper end portion of the pillar type active pattern 116 surrounded by the second tensile layer 118. In an embodiment of the present invention, the first and second junction regions 102, 116 are each formed as N-type ion implantation layers. The first junction region 102 is formed within the surface of the semiconductor substrate 100, and (as shown in FIG. 1) is formed as a linear type junction region (e.g., in FIG. 1, the first junction region 102 formed in the semiconductor substrate 100 extends linearly among the vertical transistors). A gate 108a is formed at a side wall of the pillar type active pattern 116 over the first tensile layer 104 so as to surround a portion of the pillar type active pattern 116 between the first tensile layer 104 and the second tensile layer 118.

First and second insulation layers 106, 110 are interposed between the gate 108a and the first tensile layer 104 and the gate 108a and the second tensile layer 118, respectively; and a third insulation layer 112 and a Si layer 114 are interposed between the gate 108a and the pillar type active pattern 116. The first insulation layer 106 is formed, for example, as an oxide layer, and the second and third insulation layer 110, 112 are each formed, for example, as nitride layers. A fourth insulation layer 120 is formed over the second insulation layer 110 and the second tensile layer 118, a fifth insulation layer 122 is linearly formed over the first insulation layer 106 and the fourth insulation layer 120, and a sixth insulation layer 124 (on which surface planarization is completed) is formed over the fifth insulation layer 122. In an embodiment of the present invention, the fourth insulation layer 120 and the sixth insulation layer 124 are formed as oxide layers, and the fifth insulation layer 122 is formed as a nitride layer.

In the vertical transistor in accordance with an embodiment of the present invention as described above, the first and second junction region respectively formed at upper and lower end portions of the pillar type active pattern are subject to tensile stress in a direction vertical to the channel region, i.e. in a longitudinal direction of the channel by the first and second tensile layers, for example, by the $Si_{0.99}C_{0.01}$ layer having a lattice constant smaller than Si. Therefore, in the channel region to which the tensile stress is applied, of the six faces of an Si atom having a cubic lattice structure, electrons move to a face of the Si atom having a small effective mass. As the result, in the vertical transistor according to embodiments of the present invention, despite an increase in the parasitic capacitance thereof caused by the gate structurally surrounding the pillar type active pattern, the present invention realizes improved current properties of an NMOS and improved electron mobility, and thus has enhanced operation speed.

FIGS. 2A through 2K are cross-sectional views shown for illustrating the steps of a method for forming a vertical transistor in accordance with another embodiment of the present invention.

Figure 2A:
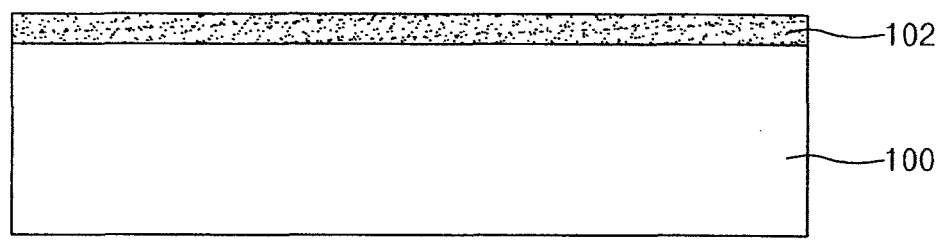
FIGS. 2A through 2K are cross-sectional views shown for illustrating the steps of a method for forming the vertical transistor in accordance with an embodiment of the present invention.

Referring to FIG. 2A, the first junction region 102 is formed within the surface of the semiconductor substrate 100. In one embodiment of the present invention, the first junction region 102 is formed, for example, by ion implanting N-type impurities into the surface of the semiconductor substrate 100.

Figure 2B:
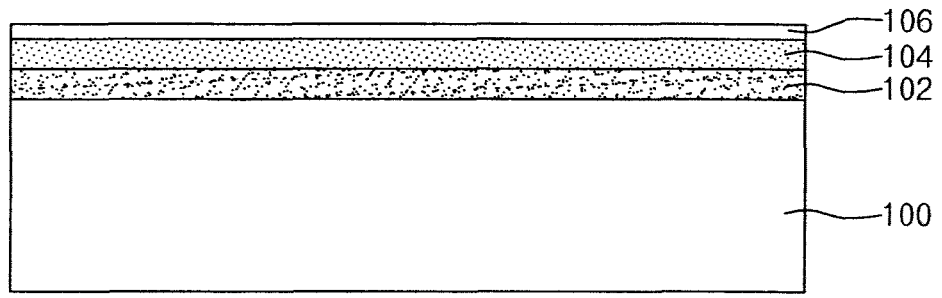

Referring to FIG. 2B, the first tensile layer 104 is formed over the first junction region 102. The first tensile layer 104 is formed as a $Si_{1-x}C_x$ layer ($0.01 \leq x \leq 0.05$); and preferably, the first tensile layer is a $Si_{0.99}C_{0.01}$ layer that is formed through Molecular Beam Epitaxy (MBE) or a cluster ion implantation process. The MBE process is carried out at 200 to 1000° C. using $Hi_2H_6$ gas and $C_2H_2$ gas. The first insulation layer 106 is formed over the first tensile layer 104. The first insulation layer 106 may be formed as, for example, an oxide layer.

Figure 2C:
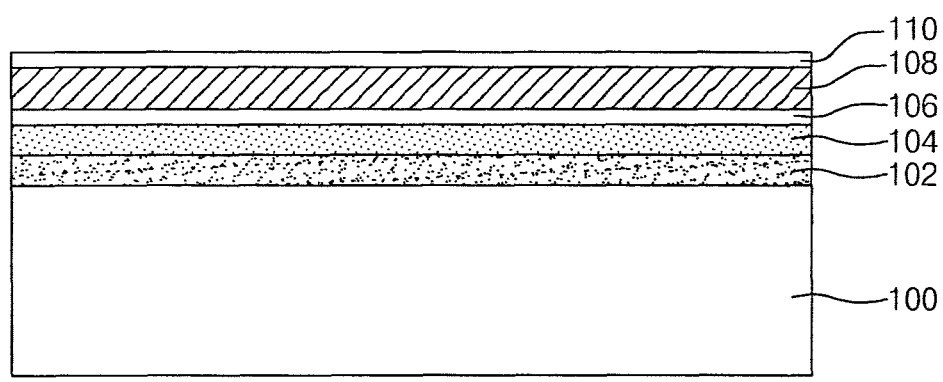

Referring to FIG. 2C, a gate conductive layer 108 is formed over the first insulation layer 106. The gate conductive layer 108 may be formed, for example, as a metal layer. The second insulation layer 110 is formed over the gate conductive layer 108 for the purpose of capping the gate conductive layer 108. The second insulation layer 110 may be formed, for example, as a nitride layer.

Figure 2D:
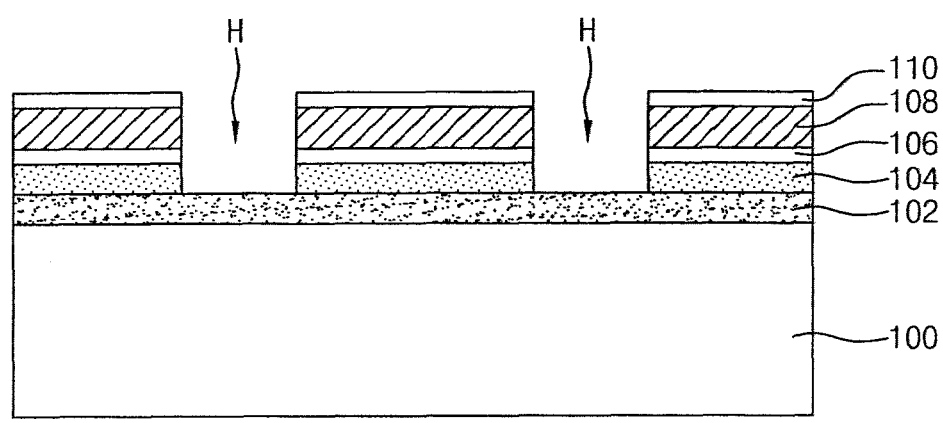

Referring to FIG. 2D, the second insulation layer 110, the gate conductive layer 108, the first insulation layer 106 and the first tensile layer 104 are etched to form a hole H exposing the first junction region 102.

Figure 2E:
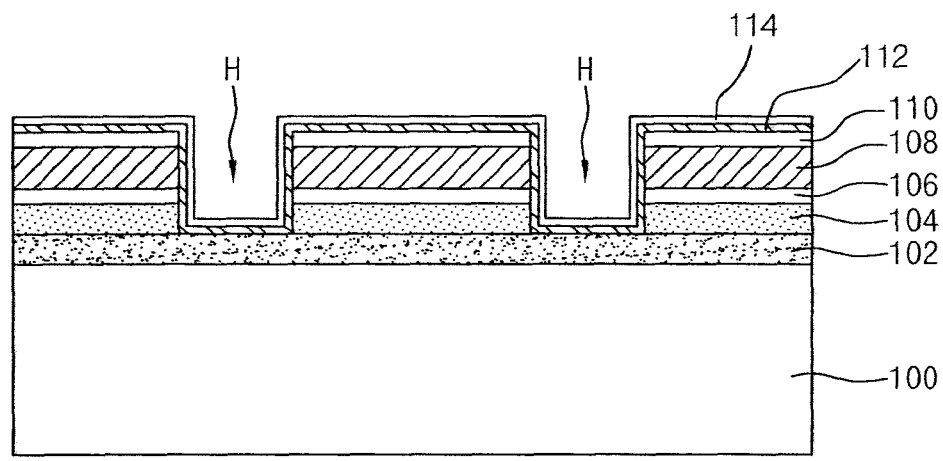

Referring to FIG. 2E, the third insulation layer 112 is formed over the second insulation layer 110 and on the surface of the hole H. The third insulation layer 112 serves the purpose of capping the gate conductive layer 108, and may be formed, for example, as a nitride layer through plasma nitriding. A Si layer 114 is formed over the third insulation layer 112 through an atomic layer deposition (ALD) process. Over the Si layer 114, an oxide layer (not shown) and a nitride layer (not shown) are additionally formed in turn.

Figure 2F:
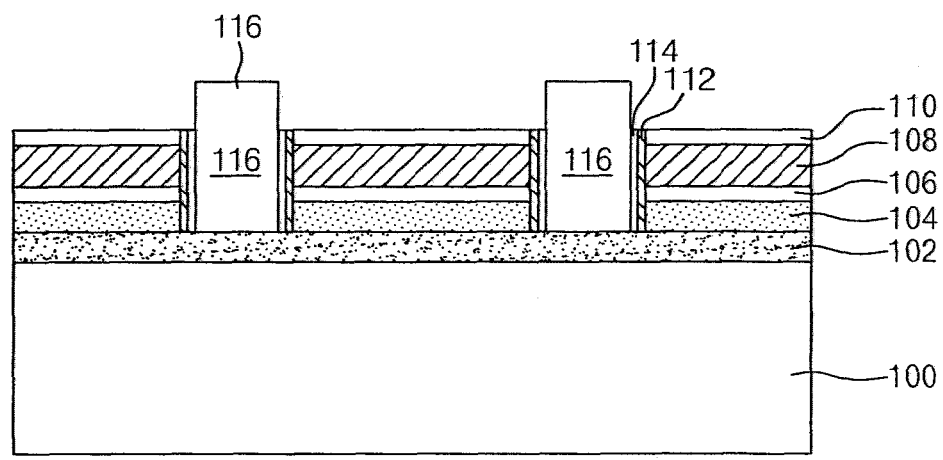

Referring to FIG. 2F, the portions of the Si layer 114 and the third insulation layer 112 formed over the first junction region 102 in the bottom of the hole H and the portions of Si layer 114 and the third insulation layer 112 formed over the second insulation layer 110 are removed while leaving only the Si layer 114 and the third insulation layer 112 formed on the side wall of the hole H. The etching is performed in a self-aligned manner.

Meanwhile, in an embodiment of the present invention in which the oxide layer and the nitride layer are also formed over the Si layer 114, the additional oxide layer and nitride layer are removed by a chemical after the etching process to expose the Si layer 114 on the side wall of the hole H.

From the exposed Si layer 114 and the bottom of the hole H, an epitaxial Si layer is grown through a Selective Epitaxial Growth (SEG) process to form the pillar type active pattern 116 within the hole H. The pillar type active pattern 116 is formed so as to protrude above the hole H, i.e., so as to protrude from the second insulation layer 110.

Figure 2G:
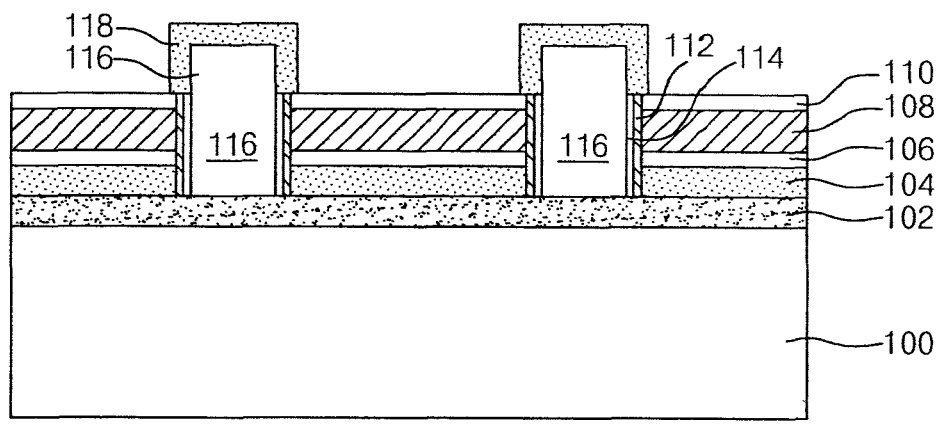

Referring to FIG. 2G, the second tensile layer 118 is formed over the protruding portion of the pillar type active pattern 116. The second tensile layer 118 is formed so as to surround the upper surface and side surface of the protruded portion of the pillar type active pattern 116. The second tensile layer 118 is formed (like the first tensile layer 104) as a $Si_{1-x}C_x$ layer ($0.01 \leq x \leq 0.05$), and preferably is formed as a $Si_{0.99}C_{0.01}$ layer through MBE or cluster ion implantation process. The MBE process is carried out at 200 to 1000° C. using $Hi_2H_6$ gas and $C_2H_2$ gas.

Figure 2H:
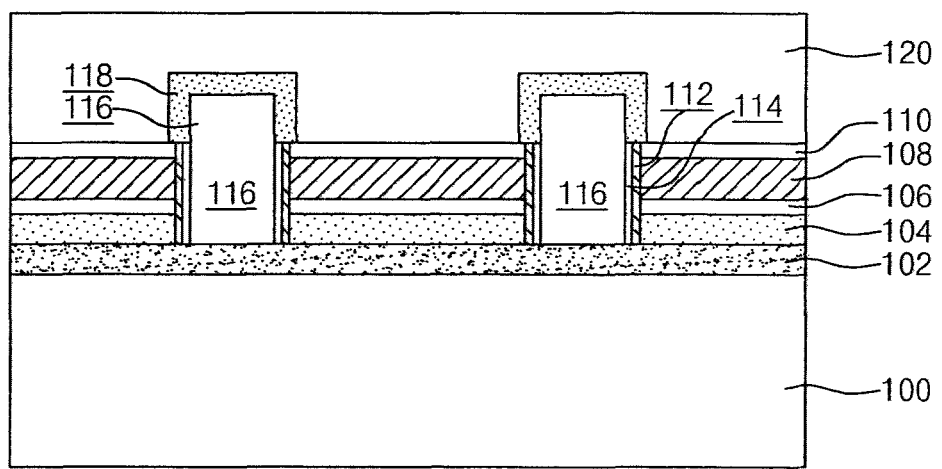

Referring to FIG. 2H, the fourth insulation layer 120 is formed over the second tensile layer 118 and the second insulation layer 110. The fourth insulation layer 120 may be formed, for example, as an oxide layer. The surface of the fourth insulation layer 120 is planarized using a Chemical Mechanical Polishing (CMP) process.

Figure 2I:
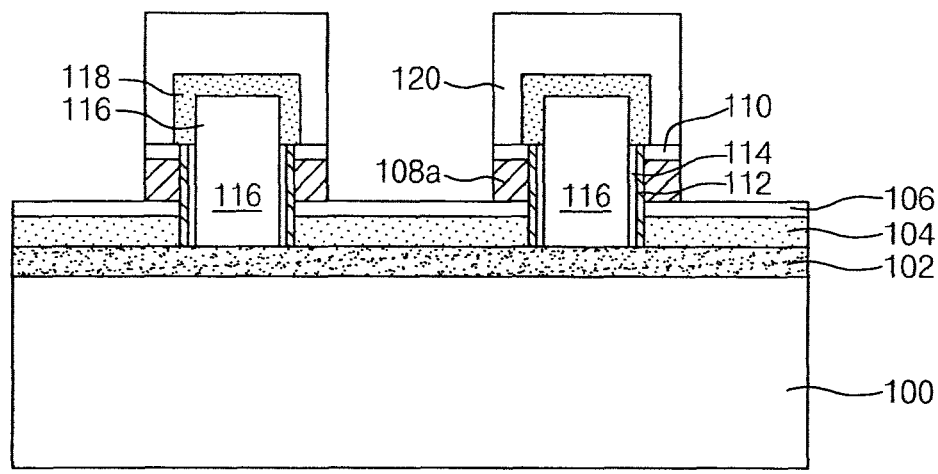

Referring to FIG. 2I, the fourth insulation layer 120, the second insulation layer 110 and the gate conductive layer 108 are etched such that the gate 108a is formed on the side wall of the pillar type active pattern 116. The gate 108a is preferably formed in an annular shape surrounding the outer surface of the lower end portion of the pillar type active pattern 116.

Figure 2J:
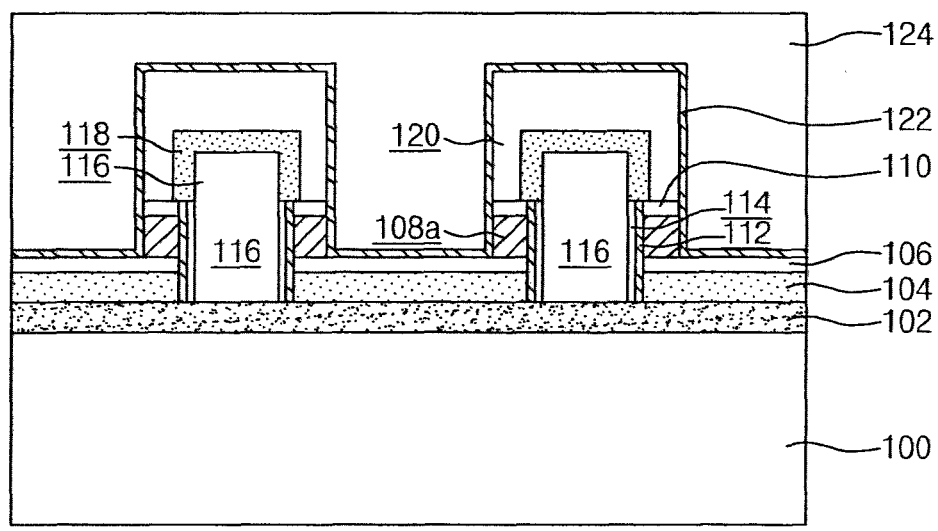

Referring to FIG. 2J, the fifth insulation layer 122 is formed over the resultant product of the semiconductor substrate formed with the gate 108a for the purpose of capping the gate 108a. The fifth insulation layer 122 may be formed, for example, as a nitride layer. The sixth insulation layer 124 is formed over the fifth insulation layer 122 so as to fill the space between the pillar type active patterns 116. The sixth insulation layer 124 may be formed, for example, as an oxide layer.

Figure 2K:
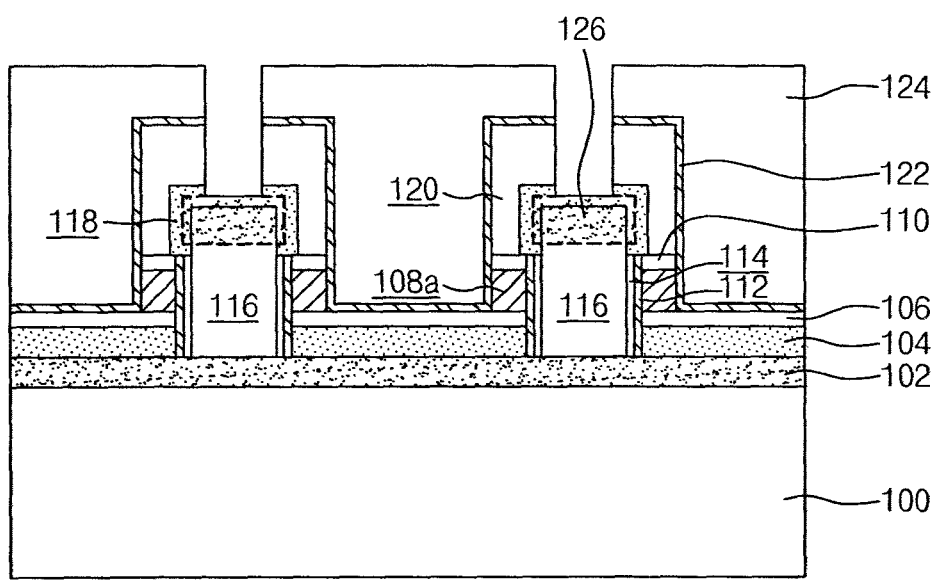

Referring to FIG. 2K, the sixth insulation layer 124, the fifth insulation layer 122 and the fourth insulation layer 120 are etched to expose a portion of the second tensile layer 118 formed over the upper end portion of the pillar type active pattern 116. During the etching process, some thickness of the second tensile layer 118 may also be etched. N-type impurities are ion implanted into the upper portion of the pillar type active pattern 116 below the exposed portion of the second tensile layer 118 to form the second junction region 126.

After that, though not shown, a serious of known follow up processes are sequentially performed, thereby completing the vertical transistor in accordance with an embodiment of the present invention.

As is apparent from the above description, in the present invention, a tensile stress is applied to the channel region in a longitudinal direction of the channel when $Si_{0.99}C_{0.01}$ layers having a lattice constant smaller than Si is formed. Therefore, in the channel region to which the tensile stress is applied, electrons move to a face of an Si atom (the Si atom having a cubic lattice structure with six faces) having a small effective mass. As the result, in the vertical transistor of the present invention, despite an increase in the parasitic capacitance caused by the gate structurally surrounding the pillar type active pattern, the present invention realizes improved current properties of an NMOS and improved electron mobility. Therefore, the present invention can enhance the operation speed of the vertical transistor.

Although specific embodiments of the present invention have been described for illustrative purposes, those skilled in the art will appreciate that various modifications, additions and substitutions are possible, without departing from the scope and spirit of the invention as disclosed in the accompanying claims.

The invention claimed is:

1. A vertical transistor, comprising:
   a semiconductor substrate having a pillar-shaped active pattern over a surface thereof;
   a first tensile layer formed over the semiconductor substrate at a lower end portion of the pillar-shaped active pattern and a second tensile layer formed at an upper end portion of the pillar-shaped active pattern, the first and second tensile layers applying a tensile stress to the pillar-shaped active pattern in a vertical direction;
   a first junction region formed within the surface of the semiconductor substrate below the first tensile layer and the pillar-shaped active pattern;
   a gate surrounding at least a portion of the pillar-shaped active pattern; and
   a second junction region formed within the upper end portion of the pillar-shaped active pattern
   wherein the first tensile layer is formed only over the semiconductor substrate at a lower end portion of the pillar-shaped active pattern and the second tensile layer is formed only at an upper end portion of the pillar-shaped active pattern, the first and second tensile layers applying a tensile stress to a channel region of the pillar-shaped active pattern in a vertical direction.

2. The vertical transistor according to claim 1, wherein the pillar-shaped active pattern comprises an epitaxial Si layer.

3. The vertical transistor according to claim 1, wherein the first and second tensile layers each comprises a $Si_{1-x}C_x$ layer.

4. The vertical transistor according to claim 3, wherein x is in a range of $0.01 \leq x \leq 0.05$.

5. The vertical transistor according to claim 1, wherein the second tensile layer is formed so as to cover side and upper surfaces of the upper end portion of the pillar-shaped active pattern.

6. The vertical transistor according to claim 1, wherein the first tensile layer is formed so as to surround the lower end portion of the pillar-shaped active pattern.

7. A vertical transistor, comprising:
   a semiconductor substrate having a pillar-shaped active pattern over a surface thereof;

a first tensile layer comprising a $Si_{1-x}C_x$ layer formed over the semiconductor substrate at a lower end portion of the pillar-shaped active pattern;

a second tensile layer comprising a $Si_{1-x}C_x$ layer formed at an upper end portion of the pillar-shaped-active pattern;

a first junction region formed within the surface of the semiconductor substrate below the first tensile layer and the pillar-shaped active pattern;

a gate surrounding at least a portion of the pillar-shaped active pattern; and a second junction region formed within the upper end portion of the pillar-shaped active pattern, wherein the first tensile layer is formed only over the semiconductor substrate at a lower end portion of the pillar-shaped active pattern and the second tensile layer is formed only at an upper end portion of the pillar-shaped active pattern, the first and second tensile layers applying a tensile stress to a channel region of the pillar-shaped active pattern in a vertical direction.

8. The vertical transistor according to claim 7, wherein the pillar-shaped active pattern comprises an epitaxial Si layer.

9. The vertical transistor according to claim 8, wherein the gate comprises an Si layer and an insulation layer surrounding the eptiaxial Si layer.

10. The vertical transistor according to claim 7, wherein x is in a range of $0.01 \le x \le 0.05$.

11. The vertical transistor according to claim 7, wherein the second tensile layer is formed so as to cover side and upper surfaces of the upper end portion of the pillar-shaped active pattern.

12. The vertical transistor according to claim 7, wherein the first tensile layer is formed so as to surround the lower end portion of the pillar-shaped active pattern.

13. The vertical transistor according to claim 7, wherein the second junction region comprises N-type impurities, and first and second insulation layers are formed over the second tensile layer so as to cover the second tensile layer, the first and second insulation layers having a hole therein exposing a portion of the second tensile layer at the upper surface of the pillar-shaped active pattern.

* * * * *